(12) United States Patent
Yao

(10) Patent No.: US 10,969,411 B2
(45) Date of Patent: Apr. 6, 2021

(54) POLARIZATION INSENSITIVE CURRENT AND MAGNETIC SENSORS WITH ACTIVE TEMPERATURE COMPENSATION

(71) Applicant: Xiaotian Steve Yao, Diamond Bar, CA (US)

(72) Inventor: Xiaotian Steve Yao, Diamond Bar, CA (US)

(73) Assignee: Xiaotian Steve Yao, Diamond Bar, CA (US)

( * ) Notice: Subject to any disclaimer, the term of this patent is extended or adjusted under 35 U.S.C. 154(b) by 659 days.

(21) Appl. No.: 15/435,213

(22) Filed: Feb. 16, 2017

(65) Prior Publication Data
US 2017/0234913 A1  Aug. 17, 2017

Related U.S. Application Data

(60) Provisional application No. 62/295,919, filed on Feb. 16, 2016.

(51) Int. Cl.
*G01R 15/24* (2006.01)
*G01R 19/32* (2006.01)
*G02B 1/00* (2006.01)

(52) U.S. Cl.
CPC .......... *G01R 15/246* (2013.01); *G01R 19/32* (2013.01)

(58) Field of Classification Search
CPC ......... G02B 1/00; G02B 2207/00; G06F 1/00; G01C 1/00
See application file for complete search history.

(56) References Cited

U.S. PATENT DOCUMENTS

| | | | | |
|---|---|---|---|---|
| 2003/0004412 A1* | 1/2003 | Izatt | ...................... | A61B 5/6852 600/425 |
| 2010/0265014 A1* | 10/2010 | Bowers | .................. | G02B 27/56 333/21 R |
| 2011/0277552 A1* | 11/2011 | Chen | ......................... | G01J 4/00 73/763 |
| 2014/0300341 A1* | 10/2014 | Davis | ................... | G01R 15/247 324/97 |
| 2015/0097551 A1* | 4/2015 | Yao | ........................ | G01K 11/32 324/96 |
| 2016/0011237 A1* | 1/2016 | Konno | ................. | G01R 15/246 324/96 |

* cited by examiner

*Primary Examiner* — Jermele M Hollington
*Assistant Examiner* — Temilade S Rhodes-Vivour
(74) *Attorney, Agent, or Firm* — Perkins Coie LLP

(57) ABSTRACT

This patent document discloses techniques and devices for sensing or measuring electric currents and/or temperature based on photonic sensing techniques. The optical sensors for sensing the current or temperature can be configured as a polarization-insensitive optical sensor in either an optical transmissive configuration or an optical reflective configuration.

25 Claims, 12 Drawing Sheets

Polarization insensitive current/magnetic sensor design

POLARIZATION INSENSITIVE CURRENT AND MAGNETIC SENSORS WITH ACTIVE TEMPERATURE COMPENSATION

CROSS REFERENCE TO RELATED APPLICATIONS

This patent document claims the benefit of priority of U.S. Provisional Patent Application No. 62/295,919, filed on Feb. 16, 2016. The entire content of the before-mentioned patent application is incorporated by reference as part of the disclosure of this document.

TECHNICAL FIELD

This patent application relates to techniques and devices for sensing an electric current and temperature.

BACKGROUND

An electric current is an electrical signal due to flow of charges in an electrically conductive path such as a metal. Given the electrical nature of the electric currents, techniques and devices for sensing or measuring an electric current have been largely based on electronic circuits. Electronic circuits usually require electrical power and can be adversely affected by electromagnetic interference (EMI). Various electronic circuits for sensing currents need to be located at the locations where the currents are measured and this may impose practical limitations in various applications.

SUMMARY

This patent application discloses techniques and devices for sensing or measuring electric currents and temperature based on detecting light from a photonic sensor head deployed at a location where a current or temperature is measured. In the disclosed optical sensing technology, the sensing media are optical dielectric materials exhibiting Faraday effects and therefore provide immunity to EMI. The disclosed optical sensing uses light to transmit light carried with the current or temperature information obtained at the sensing location to a remote base station and this optical transmission allows a long distance remote sensing. In addition, the optical processing of the detected signals provides additional advantages that are missing or difficult to achieve in other sensing techniques that are entirely based on electronic circuitry.

DETAILED DESCRIPTION

Figure 1:
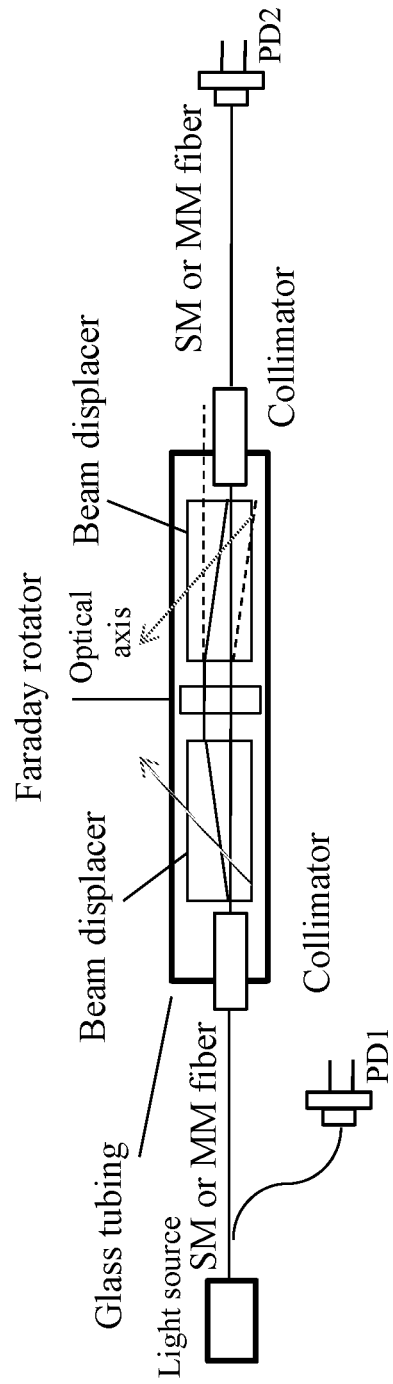
FIG. 1 shows a first example of a polarization-insensitive optical current sensor by implementing the disclosed technology in which the output beam displacer is rotated 45 degrees so that 50% light is output from the output fiber.

Sensing of an electric current based on a fiber optic current sensor is attractive for monitoring, control, and protection of substations and power distribution systems in smart grid. Comparing with some existing current sensors, they have the advantage of being able to separate the sensor head that senses the current to be measured and electronic processing unit for processing a signal that contains the current information at different locations, and can use the optical sensing nature of such technology to eliminate any electrical power and electronic circuitry at the sensor head, making the sensor head immune to electromagnetic interferences or damages triggered by strong electromagnetic fields or interferences and safe for high voltage applications. Implementations of fiber optic current sensors can be configured to achieve other advantages, including small size, light weight, low power consumption, immunity to current saturation or others. Some implementations of optical current sensors based on Faraday effects in glasses or crystals have the advantages of compact size, light weight, low cost, and easy installation e.g., being able to be directly mounted on a current conducting cable even with a live current flow, and can significantly reduce the installation cost. Because of the low cost and small size, they can be applied to low and medium voltage applications for transformer monitoring and other current sensing applications.

Accuracy, dynamic range, and environmental stability are the main performance indicators for the fiber optic current sensors. An effective way to increase the dynamic range is to increase the magnetic field detection sensitivity, requiring significantly reducing the noise in optoelectronics detection circuitry. The temperature dependence of the Verdet constants of the Faraday glasses or crystals poses challenges for the for the measurement accuracy and need to be addressed in the sensor systems design. The temperature effect on the optical signal derived from the sensor head can impact the environmentally stable operation of the sensor, and thus it is advantageous to provide a mechanism for compensating for the temperature effect. In addition, interferences of the magnetic fields from the neighboring current carrying conductors can also affect the current detection accuracy, and thus should be reduced or minimized.

In the disclosed technology, optical sensing can be used to remotely measure electric currents or temperature by directing probe light from a base station via an optical fiber to an optical sensor head deployed at a target location to use the probe light to obtain and carry the information of the current or temperature to be measured and redirecting the probe light from the optical sensor head back to a base station for processing. Certain technical features in connection with the technology disclosed in this patent document are related to or described in U.S. Patent Publication No. U.S. 2015/0097551 A1 on Apr. 9, 2015 of U.S. patent application Ser. No. 14/509,015 entitled "FARADAY CURRENT AND TEMPERATURE SENSORS" and filed on Oct. 7, 2014 based on U.S. Provisional Application No. 61/887,897 filed Oct. 7, 2013. Both patent documents are incorporated by reference as part of this patent document.

Fiber optic current sensor is attractive for various applications, including, e.g., the monitoring, control, and protection of substations and power distribution systems in smart grid and in aluminum production using electrolysis process. Comparing with traditional current sensors, they have the advantage of being able to separate the sensor head and electronic processing unit in different locations, and therefore do not require any electrical power at the sensor head, making it safe for high voltage applications. In addition, they are generally more accurate than their electrical counterpart, especially over wide temperature ranges. Other advantages include small size, light weight, immune to electromagnetic interferences, low power consumption, and no current saturation. Accuracy, dynamic range, and environmental stability are the main performance indicators for the fiber optic current sensors. An effective way to increase the dynamic range is to increase the magnetic field detection sensitivity, requiring significantly reducing the noise in optoelectronics detection circuitry. The temperature dependence of the Verdet constants of the Faraday glasses or crystals poses challenges for the for the measurement accuracy and must be overcome in the sensor systems design. In addition, the temperature effect on optical signal derived from the sensor head is also critical for achieving environmentally stable operation of the sensor, and must be considered and compensated.

Compact sensor designs may use a sensor head that is polarization sensitive and the output powers can fluctuate with the polarization of the input light changes. Such polarization sensitivity can be reduced by using a light source with a low degree of polarization (DOP), such as an Amplified spontaneous emission (ASE) source, in optical configurations illustrated in this document. The reflective designs shown in the examples in this document can be used to simplify the overall optical packaging to provide improved sensing performance.

For example, some implementations of the disclosed reflective designs do not impose a requirement on the polarization orientation of the input optical device with respect to the input light with low DOP. This disclosed aspect reduces the sensitivity of the optical sensor head to the optical polarization. For another example, a polarizer placed after the Faraday sensing material may be removed in various designs. In addition, temperature sensing can be implemented based on current sensor designs and can be used for compensating temperature sensitivity of the Faraday material used in the current sensor head. Reflective designs using optical fiber as the sensing material are also provided in this document. Some disclosed designs are configured to integrate the current sensor with the temperature sensor for achieving high environmental stability with low cost.

In the examples described in this document, the current sensor head is an all optical current sensor head formed by optical components without local electronic circuits or components. In this regard, the sensor head does not include any optical detector and directs light carrying the measurement information of the current to the current sensor base station via a fiber link. The all-optical current sensor head is placed by the current-carrying conductor to sense the current based on the optical polarization rotation caused by the magnetic field associated with the current in the Faraday material inside the all-optical current sensor. When the current to be measured is perpendicular to the light propagation path of the Faraday rotator, the magnetic field produced by the current is along the light propagation path of the Faraday rotator and thus exerts most influence to the polarization rotation of the light. The probe light from the broad bandwidth light source is directed to the current sensor head and a returned light beam is directed back from the current sensor head to the photodiode (PD) detection unit within the current sensor base station via fiber and is detected to extract information on the electric current sensed by the current sensor head. The low DOP property of the probe light is to assure the optical power stability passing through the sensor head if single mode fiber (SMF) or multimode fiber (MMF) is used to deliver light into the sensor head located remotely at the current sensing site. If a more expensive polarization maintaining (PM) fiber is used, a light source with high DOP can be used and the polarization axis of the probe light is aligned with the slow (or fast) axis of the PM fiber.

The optical sensor examples provided in this document are configured in polarization insensitive configurations to rotate the relative state of polarization (SOP) of two polarization components by 45 degrees to bias the sensor head to the region with the highest sensitivity and best linearity. The two polarization components can be implemented by using polarization beam splitters or beam displacers made with birefringence material, such as YOV4 or $LiNbO_3$. Configurations using optical transmission or optical reflection are provided. The disclosed designs can include an active temperature sensing based on optical sensing to compensate for the rotational sensitivity of the Faraday material used in the optical head with respect to temperature fluctuations. Specifically, permanent Faraday rotators are used to provide the desired polarization angle bias for sensing sensitivity and linearity to simplify the polarization alignment. In addition, the temperature sensitivity of the same permanent Faraday rotators is explored to sense the temperature in the optical sensing head, which in turn to be used to actively compensate for the temperature sensitivity of the Faraday sensing material. We also disclose embodiments of using wavelength division multiplexing (WDM) technique to integrate both the current/magnetic sensing and the temperature sensing into a single package.

FIG. 1 shows a first embodiment of a transmissive sensor head in a first polarization beam displacer is used to separate the two orthogonal polarization components of the input light beam and the second polarization beam displacer is used to combine the two orthogonal polarization components into the output fiber. The second polarization displacer is oriented 45 degrees from the first polarization displacer so as to bias the sensor head in the most sensitive and most linear region.

The optical sensor in FIG. 1 is a particular example of one class of an optical sensing based current sensor. Such a current sensor can include a light source that produces probe light; a first fiber line coupled to receive the probe light from the light source and to direct the received probe light along the fiber line; and an optical current sensor head coupled to the first fiber line to receive the probe light. This optical head can be configured to include an input polarization prism to separate the received probe light into first and second polarized input beams in different polarizations, a Faraday material located to receive and transmit both the first and second polarized input beams as first and second output beams with rotated polarizations in connection with a magnetic field of a current present near the Faraday material, and an output polarization prism that receives the first and second output beams from the Faraday material and directs the received first and second output beams to merge into an output probe beam carrying information of the current. A polarization direction of the input polarization prism and an polarization direction of the output polarization prism are oriented to be at 45 degrees to each other. The above sensor can also include a second fiber line coupled to the optical current sensor head to receive the output probe beam from the output polarization prism; an optical detection unit coupled to the second fiber line to receive the output probe beam from the optical current sensor head; and a measurement module that receives an detector output from the optical detection unit to obtain information of the current.

The measurement module may include a digital processor or an ASIC circuit that preforms signal processing for generating the current measurement. When the temperature is also measured or monitored as described in this document, the measurement module also performs the processing for the temperature measurement or temperature compensation in the current measurements.

Figure 2:
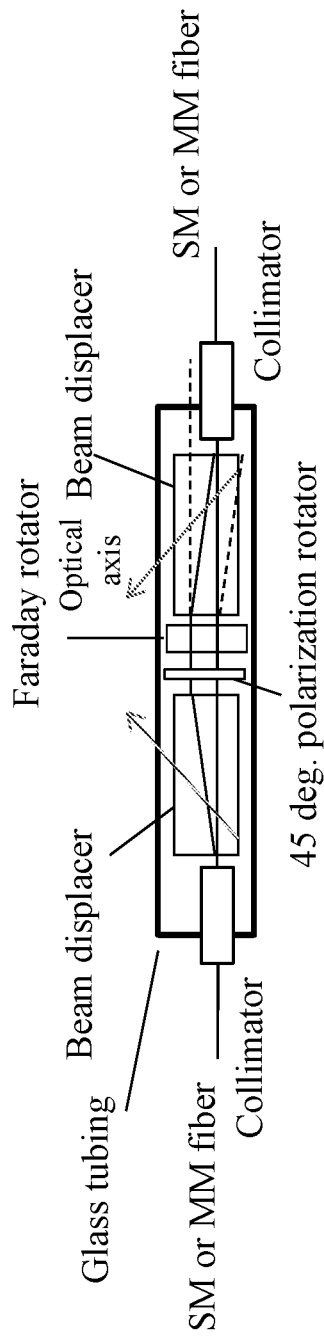
FIG. 2 shows a first example of a polarization-insensitive optical current sensor by implementing the disclosed technology in which a permanent Faraday rotator with a 45 degree rotation is placed in front of the second beam displacer so that 50% light is output from the output fiber.

FIG. 2 shows an embodiment of a transmissive sensor head in which a permanent Faraday rotator with a nominal rotation angle of 45 degrees is placed in front of the Faraday sensing material. The first polarization beam displacer is used to separate the two orthogonal polarization components of the input light beam and the second polarization beam displacer is used to combine the two orthogonal polarization components into the output fiber. Note that the permanent Faraday rotator should be operating in deep saturation and thus is not sensitive to the external magnetic field to be sensed. In addition, one may enclose the permanent Faraday rotator in a magnetically shielding material to further shield it from the external magnetic field to be sensed. In order to remove the effect of optical power fluctuation or drift of the light source, the optical power before the sensing head can be measured and the ratio of the output power to the input power is linearly proportional to the magnetic field to be sensed.

The example in FIG. 2 is one specific implementation of a current sensor based on optical sensing. Such a sensor can include a light source that produces probe light; a first fiber line coupled to receive the probe light from the light source and to direct the received probe light along the fiber line; and an optical current sensor head coupled to the first fiber line to receive the probe light. The optical head can be configured to include an input polarization prism to separate the received probe light into first and second polarized input beams in different polarizations, a Faraday rotator located to receive and transmit both the first and second polarized input beams with a rotation of 45 degrees in polarization, a Faraday material located to receive and transmit both the first and second polarized input beams from the Faraday rotator as first and second output beams with rotated polarizations in connection with a magnetic field of a current present near the Faraday material, and an output polarization prism that receives the first and second output beams from the Faraday material and directs the received first and second output beams to merge into an output probe beam carrying information of the current. The sensor further includes a second fiber line coupled to the optical current sensor head to receive the output probe beam from the output polarization prism; an optical detection unit coupled to the second fiber line to receive the output probe beam from the optical current sensor head; and a measurement module that receives an detector output from the optical detection unit to obtain information of the current.

Figure 3:
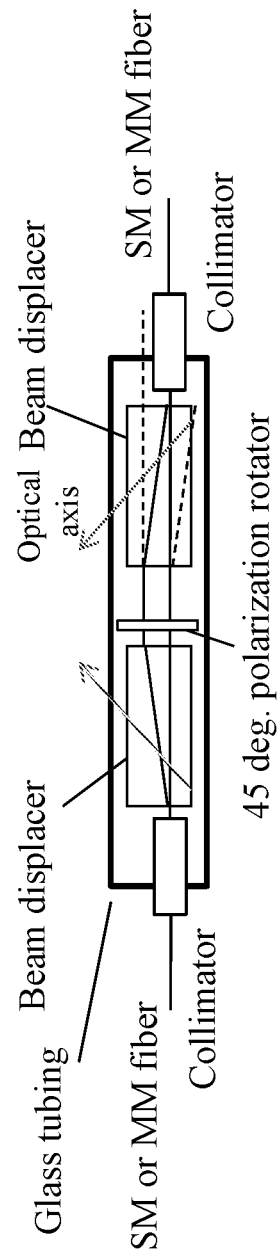
FIG. 3 shows an example of an optical temperature sensor based on the disclosed technology in which a permanent Faraday rotator with a 45 degree rotation is placed in front of the second beam displacer so that 50% light is output from the output fiber.

FIG. 3 shows an embodiment of a transmissive temperature sensor head design in which the magnetic sensing material in FIG. 2 is removed, only the permanent Faraday rotator with a 45 degree rotation remains. Because of the temperature sensitivity of the permanent Faraday rotator, the output optical power is proportional to the temperature and therefore the temperature can be obtained by measuring the output optical power. In order to eliminate the power fluctuation of drift of the light source, the optical power before the sensing head is monitored and the power ratio should be proportional to the temperature.

The sensor in FIG. 3 is an example of an optical temperature sensing with a built-in temperature sensing using the Faraday optical effect. In some implementations, such a temperature sensor can include a light source that produces probe light; a first fiber line coupled to receive the probe light from the light source and to direct the received probe light along the fiber line; an optical temperature sensor head coupled to the first fiber line to receive the probe light and configured to include an input polarization prism to separate the received probe light into first and second polarized input beams in different polarizations, a Faraday rotator that is magnetically shielded from an influence of any external magnetic field and located to receive and transmit both the first and second polarized input beams with a rotation of at or near 45 degrees in polarization as first and second output beams, and an output polarization prism that receives the first and second output beams from the Faraday rotator and directs the received first and second output beams to merge into an output probe beam carrying information of the temperature at the Faraday rotator; a second fiber line coupled to the optical temperature sensor head to receive the output probe beam from the output polarization prism; an optical detection unit coupled to the second fiber line to receive the output probe beam from the optical temperature sensor head; and a measurement module that receives an detector output from the optical detection unit to obtain information of the temperature.

Figure 4:
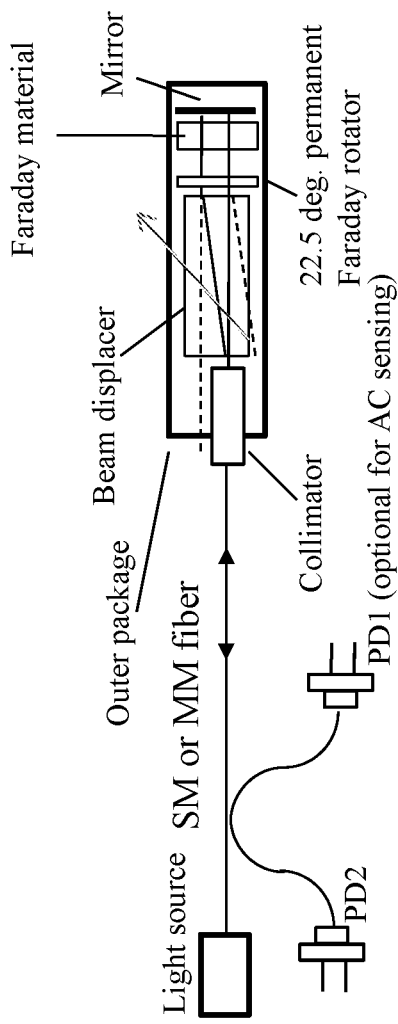
FIG. 4 shows an example of a polarization-insensitive optical current sensor by implementing the disclosed technology in an optical reflective configuration in which the same fiber is used to direct the probe light into the sensor module and to receive the reflected light from the sensor module for detecting the current.

FIG. 4 shows an embodiment of a reflective magnetic or current sensor head design in which a permanent Faraday with a nominal rotation angle of 22.5 degrees is placed before or after the Faraday sensing material. The polarization beam displacer is used both as the polarization beam splitter and combiner. The advantage of the reflective design is the compact size and low cost. Again the permanent Faraday rotator should be operating in deep saturation and/or magnetically shielded so that is not sensitive to the external magnetic field to be sensed. Note that if alternating (AC) current or magnetic field is to be sensed, PD1 in FIG. 6 can be removed and the current or magnetic filed can be obtained from the ratio of AC to DC components.

The example in FIG. 4 is one particular implementation of a current sensor based on optical sensing in a reflection mode. Such a sensor can include a light source that produces probe light; a fiber line coupled to receive the probe light from the light source and an optical current sensor head coupled to the fiber line to receive the probe light. The optical head can be configured to include a polarization prism to separate the received probe light into first and second polarized input beams in different polarizations, a Faraday rotator located to receive and transmit both the first and second polarized input beams with a rotation at or near 22.5 degrees in polarization, a Faraday material located to receive and transmit both the first and second polarized input beams from the Faraday rotator with rotated polarizations in connection with a magnetic field of a current present near the Faraday material, and an optical reflector located to receive and reflect the first and second input beams from the Faraday material back to the Faraday material and the Faraday rotator to reach the polarization prism which directs the received first and second output beams to merge into an output probe beam carrying information of the current. The sensor can also include a fiber collimator coupled to the fiber line to direct the probe light from the light source into the polarization prism and to direct the output probe beam from the polarization prism into the fiber line; an optical detection unit coupled to the fiber line to receive the output probe beam from the optical current sensor head; and a measurement module that receives an detector output from the optical detection unit to obtain information of the current. In FIG. 4, the optical detector PD2 in the optical detection unit is used for the optical sensing operations. In some implementations, such as the example in FIG. 4, the sensor can include an optical power detector (PD1) coupled to receive a portion of the probe light from the light source to detect a power fluctuation of the probe light. The measurement module processes the detector output from the optical detector and an output from the optical power detector in obtaining the information of the current.

Figure 5:
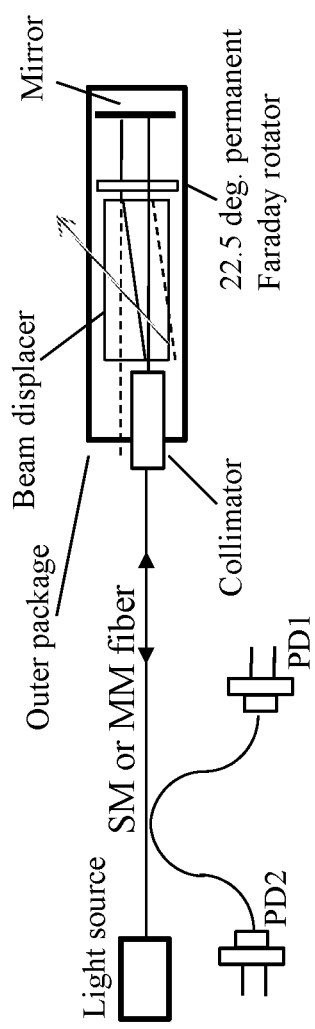
FIG. 5 shows an example of an optical temperature sensor based on the disclosed technology in an optical reflective configuration in which the same fiber is used to direct the probe light into the sensor module and to receive the reflected light from the sensor module for detecting the temperature.

FIG. 5 shows an embodiment of a reflective temperature sensor head design in which the Faraday sensing material in FIG. 4 is removed. Because the polarization rotation angle of the permanent Faraday changes as the temperature changes, the temperature can be obtained from the power ratio of the powers measured with PD1 and PD2. Such a temperature sensor based on optical sensing can include a light source that produces probe light; a fiber line coupled to receive the probe light from the light source; and an optical current sensor head coupled to the fiber line to receive the probe light. The optical head can be configured to include a polarization prism to separate the received probe light into first and second polarized input beams in different polarizations, a Faraday rotator that is magnetically shielded from an influence of any external magnetic field and located to receive and transmit both the first and second polarized input beams with a rotation of at or near 22.5 degrees in polarization as first and second output beams, and an optical reflector located to receive and reflect the first and second input beams from the Faraday material back to the Faraday material and the Faraday rotator to reach the polarization prism which directs the received first and second output beams to merge into an output probe beam carrying information of the temperature at the Faraday rotator. The sensor further includes a fiber collimator coupled to the fiber line to direct the probe light from the light source into the polarization prism and to direct the output probe beam from the polarization prism into the fiber line; an optical detection unit coupled to the fiber line to receive the output probe beam from the optical temperature sensor head; and a measurement module that receives an detector output from the optical detection unit to obtain information of the temperature.

Figure 6A:
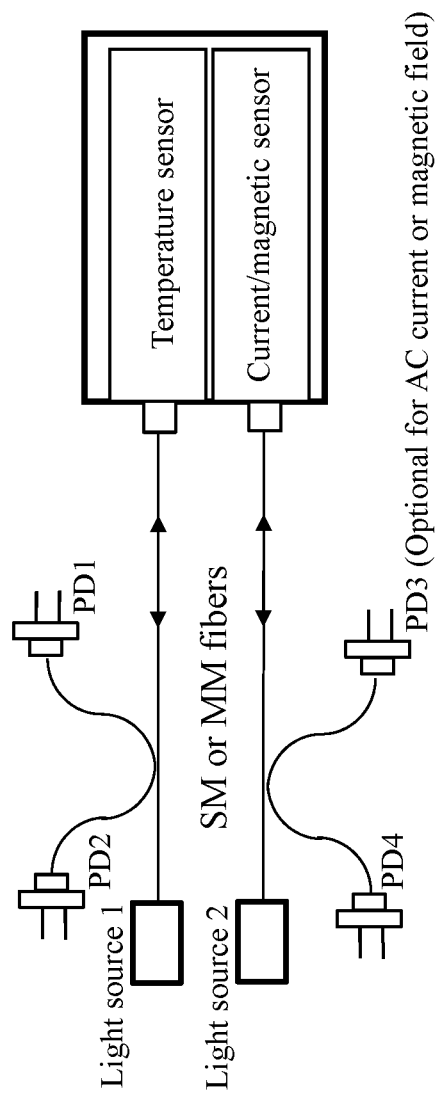
FIGS. 6A and 6B show two examples of a polarization-insensitive optical current sensor by implementing the disclosed technology by including an optical temperature sensor where both the current sensor and the temperature sensor are based on optical reflective configurations.
Figure 6B:
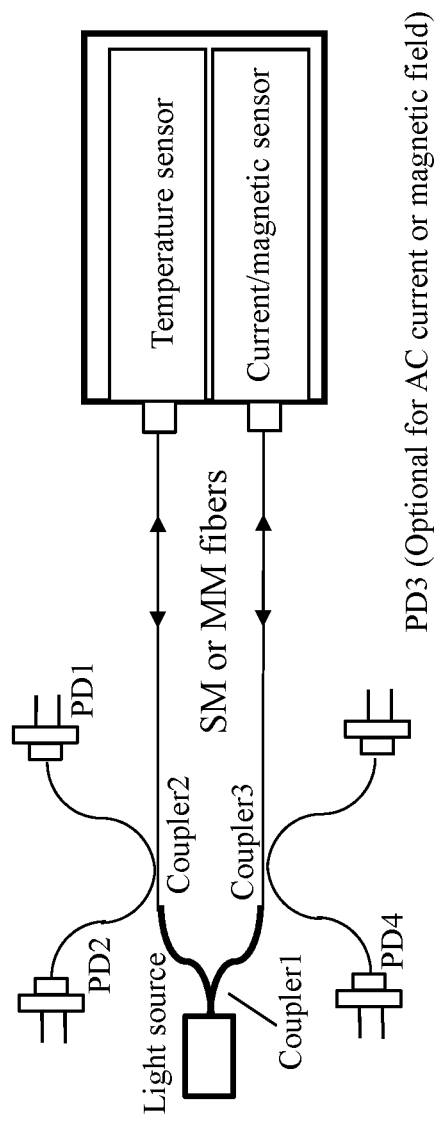

FIG. 6A and FIG. 6B show two optical sensing head designs in which a current sensor and a temperature sensor are packaged together. The temperature readings of the temperature sensor can be used to calibrate the readings of the magnetic/current sensor and compensate for the temperature sensitivity of the Faraday sensing material. The examples in FIGS. 6A and 6B, the current sensor and the temperature sensor based on optical sensing are designed to be in optical reflective configurations as shown in FIGS. 4 and 5. The current sensor and temperature sensor may also be implemented in optical transmissive configurations as shown in FIGS. 1-3. For the temperature sensor operation, two optical detectors PD1 and PD2 are provided where PD1 is used to monitor the power level of the probe beam going into the temperature sensor head and PD2 is used to monitor the power level of the reflected probe beam from the temperature sensor head. For the current/magnetic sensor operation, two optical detectors PD3 and PD4 are provided where PD3 is optional and may be used to monitor the power level of the probe beam going into the current/magnetic sensor head and PD4 is used to monitor the power level of the reflected probe beam from the current/magnetic sensor head.

Figure 7:
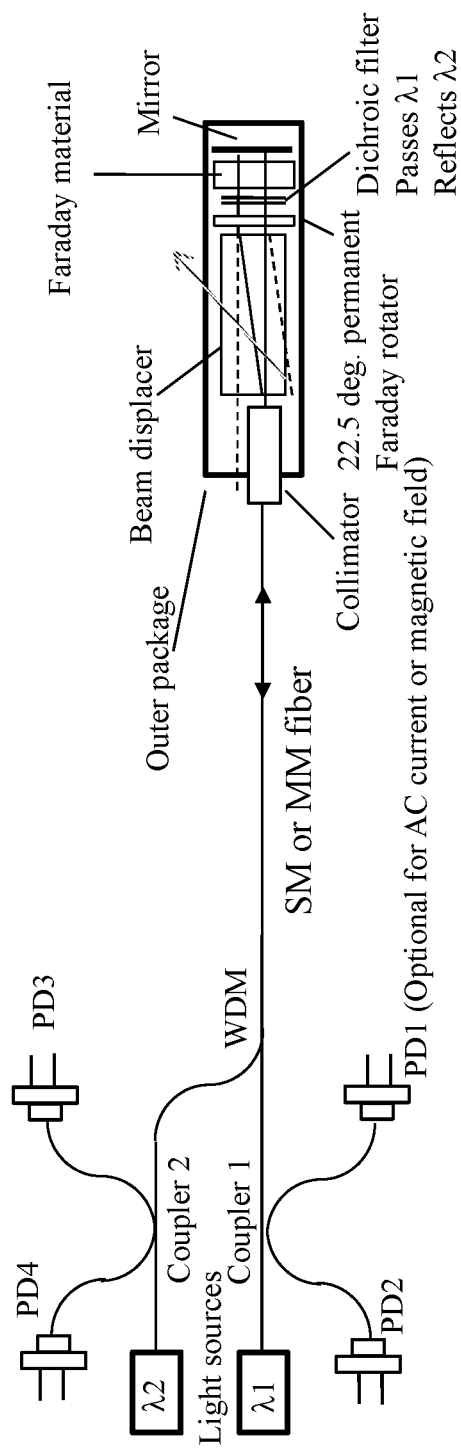
FIG. 7 shows a first embodiment of an example of a wavelength division multiplexing (WDM) current/magnetic sensor with an integrated temperature sensor wherein the λ1 channel is for the current sensing, while λ2 channel is for the temperature sensing.

FIG. 7 is a first embodiment of a wavelength division multiplexing (WDM) current/magnetic sensor with an integrated temperature sensor. Two separate light sources emitting light at wavelengths λ1 and λ2 are used in the sensor system to produce a λ1 channel for the current sensing and a λ2 channel for the temperature sensing. Light with the wavelength of λ1 forms the λ1 channel which passes through the 22.5-degree permanent Faraday rotator, the dichroic filter, the sensing Faraday material before it is reflected by the mirror back towards the input fiber. The ratio of PD1 and PD2 is used to calculate the current or the magnetic field. On the other hand, the light with the wavelength of λ2 forms the λ2 channel which passes through the 22.5-degree permanent Faraday rotator before it is reflected by the dichroic filter back towards the input fiber. The ratio of PD3 and PD4 is used to calculate the temperature.

In some implementations, a current sensor based on optical sensing and temperature compensation can include a fiber line coupled to receive probe light containing light at first and second optical wavelengths; and an optical current sensor head coupled to the fiber line to receive the probe light. The optical head can be configured to include a polarization prism to separate the received probe light into first and second polarized input beams in different polarizations, a Faraday rotator which is magnetically shielded from an external magnetic field and located to receive the first and second polarized input beams to cause a rotation in polarization, a dichroic filter located downstream from the Faraday rotator to receive light from the Faraday rotator and configured to transmit light at the first optical wavelength and reflect light at the second optical wavelength, a sensing Faraday material that is not magnetically shielded and placed in an optical path of light transmitted by the dichroic filter to sense a polarization rotation in light at the second optical wavelength caused by a temperature change and a magnetic field of an electric current at or near the sensing Faraday material, and an optical reflector downstream from the sensing Faraday material. This reflector is configured to reflect the light at the second optical wavelength back to the sensing Faraday material, the dichroic filter and the Faraday rotator to return to the polarization prism and the fiber line along with the reflected light at the first optical wavelength. The sensor further includes a first optical detector coupled to receive reflected light from the fiber line at the first optical wavelength that carries information of the current to be measured and an influence of a temperature at the optical current sensor head; a second optical detector coupled to receive reflected light from the fiber line at the second optical wavelength that carries information of the temperature at the Faraday rotator; and a measurement module that receives detector outputs from the first and second optical detectors to obtain information of the current to be measured and to compensate for an effect to the current measurement by the temperature.

The sensor can be implemented with different light sources. Some device designs can use a first light source that generates the probe light at the first optical wavelength; and a second light source that generates the probe light at the second optical wavelength. Other device designs can use a single light source that generates the probe light at the first optical wavelength and at the second optical wavelength and the probe light is coupled into the fiber line.

Figure 8:
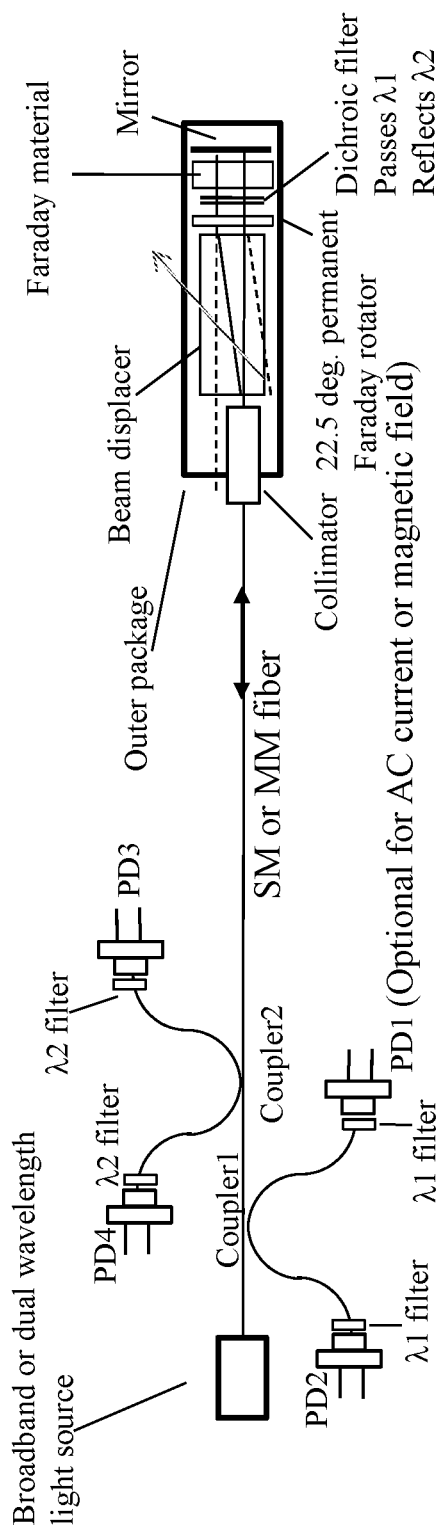
FIG. 8 shows a second embodiment of an example of a WDM current/magnetic sensor with an integrated temperature sensor wherein the λ1 channel is for the current sensing, while the λ2 channel is for the temperature sensing.

FIG. 8 is a second embodiment of a wavelength division multiplexing (WDM) current/magnetic sensor with an integrated temperature sensor. A single light source containing wavelengths λ1 and λ2, such as a broad band ASE or SLED source, is used as the light source. The λ1 channel is for the current sensing, while the λ2 channel is for the temperature sensing. Light with the wavelength of λ1 passes through the 22.5-degree permanent Faraday rotator, the dichroic filter, the sensing Faraday material before it is reflected by the mirror back towards the input fiber. The ratio of PD1 and PD2 is used to calculate the current or the magnetic field. On the other hand, light with the wavelength of λ2 passes through the 22.5-degree permanent Faraday rotator before it is reflected by the dichroic filter back towards the input fiber. The ratio of PD3 and PD4 is used to calculate the temperature. Filters passing λ1 light are placed before PD1 and PD2, while filters passing λ2 light are placed before PD3 and PD4.

Under this design, the sensor includes a first fiber coupler coupled to the fiber line to split a portion of the probe light from the light source as a first power monitor signal beam, and to split a portion of the reflected light from the optical current sensor head as a first signal beam to the first optical detector; a second fiber coupler coupled to the fiber line to split a portion of the probe light from the light source as a second power monitor signal beam, and to split a portion of the reflected light from the optical current sensor head as a second signal beam to the second optical detector; a first optical bandpass filter placed in front of the first optical detector to transmit light at the first optical wavelength into the first optical detector; a second optical bandpass filter placed in front of the second optical detector to transmit light at the second optical wavelength into the second optical detector; a first optical power monitor detector coupled to receive the first power monitor signal beam from the first fiber coupler; a third optical bandpass filter placed in front of the first optical power monitor detector to transmit light at the first optical wavelength into the first optical power monitor detector; a second optical power monitor detector coupled to receive the second power monitor signal beam from the second fiber coupler; and a fourth optical bandpass filter placed in front of the second optical power monitor detector to transmit light at the second optical wavelength into the second optical power monitor detector. The measurement module that receives detector outputs from the first and second optical detectors and the first and second optical power monitor detectors to obtain information of the current to be measured and to compensate for effects to the current measurement by the temperature and by power fluctuations at the first and second optical wavelengths in the light source.

Figure 9:
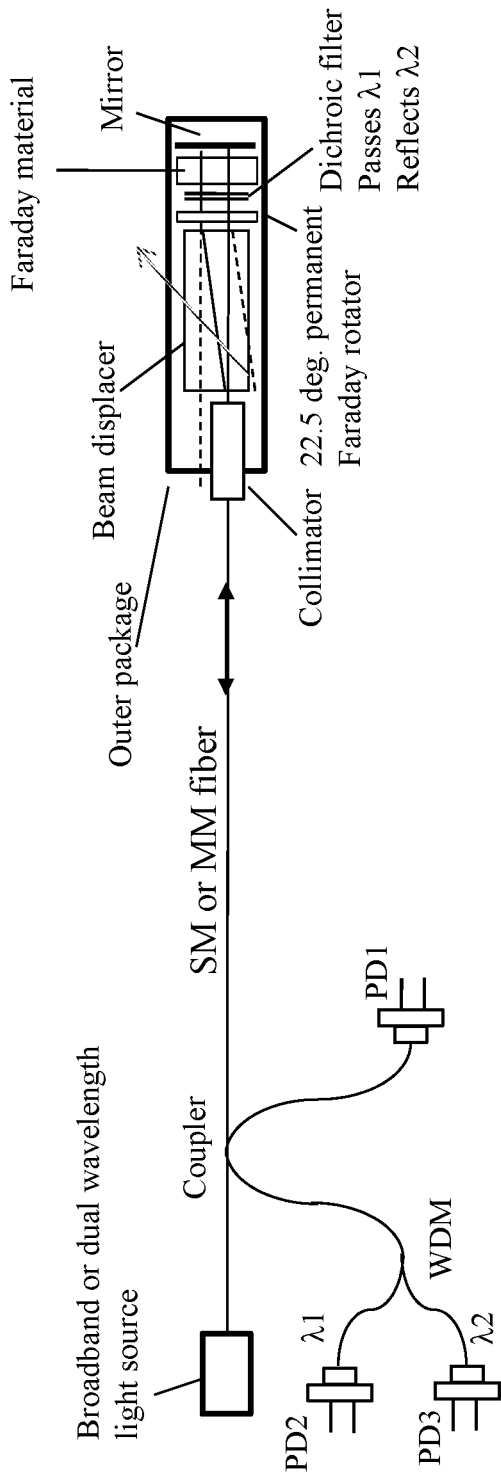
FIG. 9 shows a third embodiment of an example of a WDM current/magnetic sensor with an integrated temperature sensor wherein the λ1 channel is for the current sensing, while the λ2 channel is for the temperature sensing.

FIG. 9 is a third embodiment of a wavelength division multiplexing (WDM) current/magnetic sensor with an integrated temperature sensor. A single light source containing wavelengths λ1 and λ2, such as a broad band ASE or SLED source, is used as the light source. The λ1 channel is for the current sensing, while the λ2 channel is for the temperature sensing. Light with the wavelength of λ1 passes through the 22.5-degree permanent Faraday rotator, the dichroic filter, the sensing Faraday material before it is reflected by the mirror back towards the input fiber. The ratio of PD2 and PD1 is used to calculate the current or the magnetic field. On the other hand, light with the wavelength of λ2 passes through the 22.5-degree permanent Faraday rotator before it is reflected by the dichroic filter back towards the input fiber. The ratio of PD3 and PD1 is used to calculate the temperature. A WDM is used to separate the two wavelengths into two separate detectors PD2 and PD3. The monitoring PD1 detects both input lights of both wavelengths as the reference.

Figure 10:
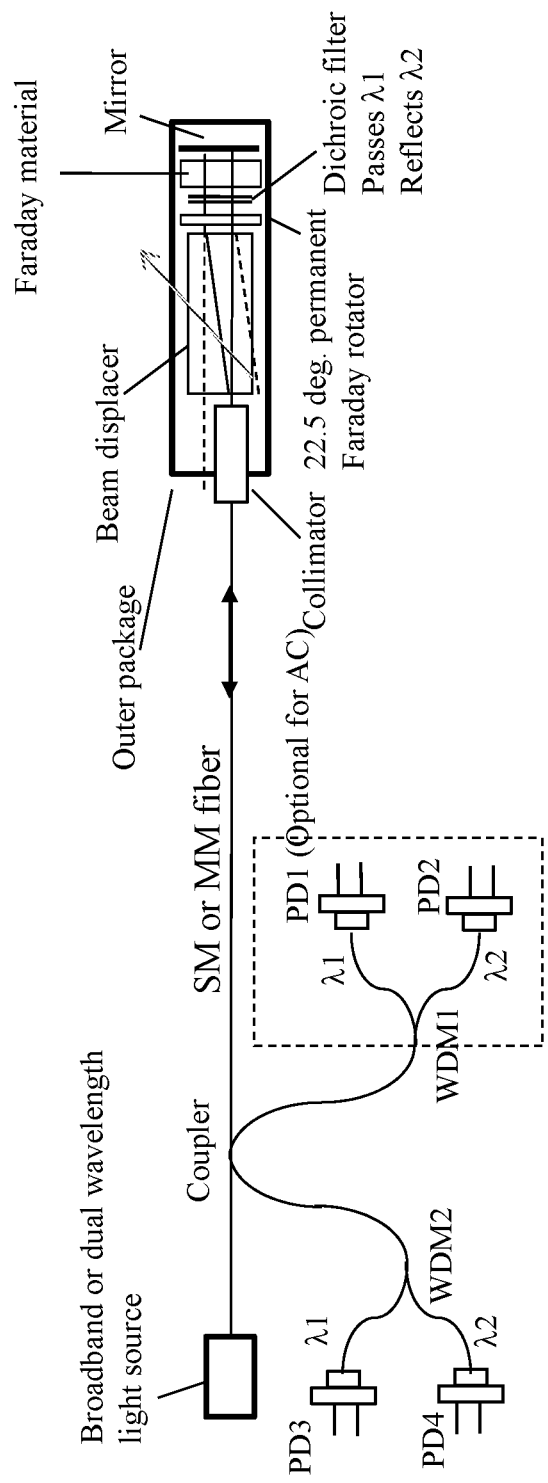
FIG. 10 shows a fourth embodiment of an example of a WDM current/magnetic sensor with an integrated temperature sensor wherein the λ1 channel is for the current sensing, while the λ2 channel is for the temperature sensing.

FIG. 10 is a fourth embodiment of a wavelength division multiplexing (WDM) current/magnetic sensor with an integrated temperature sensor. A single light source containing wavelengths λ1 and λ2, such as a broad band ASE or SLED source, is used as the light source. The λ1 channel is for the current sensing, while the λ2 channel is for the temperature sensing. Light with the wavelength of λ1 passes through the 22.5-degree permanent Faraday rotator, the dichroic filter, the sensing Faraday material before it is reflected by the mirror back towards the input fiber. The ratio of PD3 and PD1 is used to calculate the current or the magnetic field. On the other hand, light with the wavelength of λ2 passes through the 22.5-degree permanent Faraday rotator before it is reflected by the dichroic filter back towards the input fiber. The ratio of PD4 and PD2 is used to calculate the temperature. WDM1 is used to separate the two wavelengths into two separate detectors PD1 and PD2 for reference monitoring and WDM2 is used to separate the two wavelengths for the sensing signals.

Figure 11:
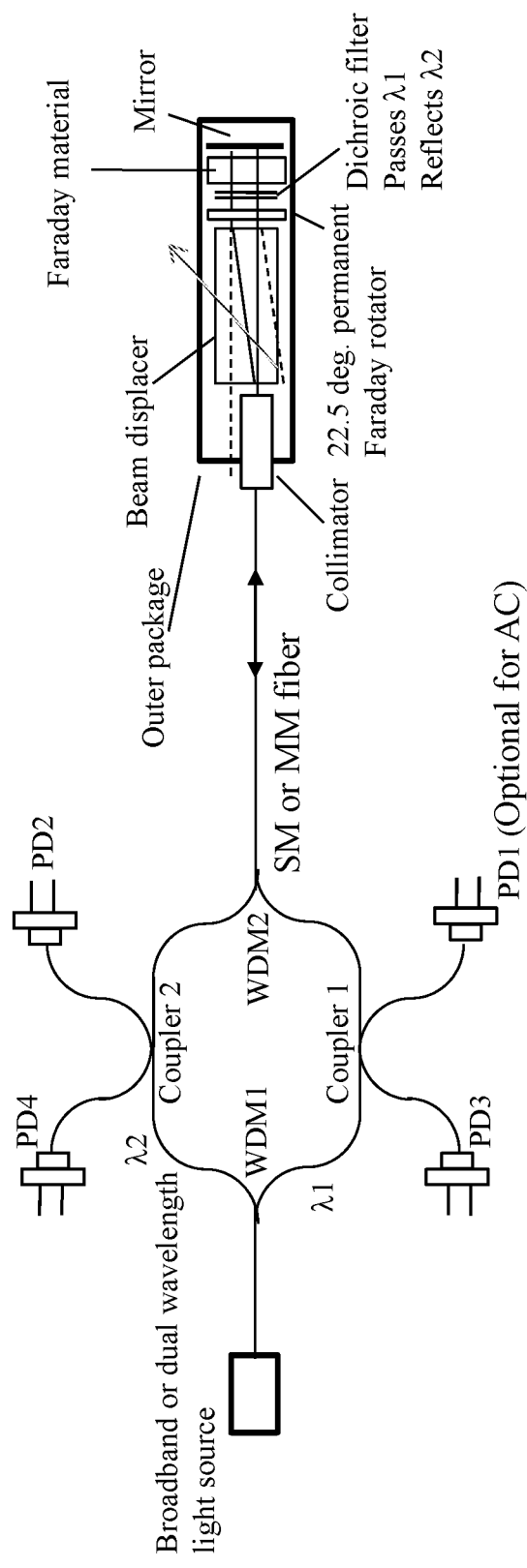
FIG. 11 shows a fifth embodiment of an example of a WDM current/magnetic sensor with an integrated temperature sensor wherein the λ1 channel is for the current sensing, while the λ2 channel is for the temperature sensing.

FIG. 11 is a fifth embodiment of a wavelength division multiplexing (WDM) current/magnetic sensor with an integrated temperature sensor. A single light source emitting light that contains different wavelengths λ1 and λ2, such as a broad band ASE or SLED source, is used as the light source. The λ1 channel is for the current sensing, while λ2 channel is for the temperature sensing. Light with the wavelength of λ1 passes through the 22.5-degree permanent Faraday rotator, the dichroic filter, the sensing Faraday material before it is reflected by the mirror back towards the input fiber. The ratio of PD3 and PD1 is used to calculate the current or the magnetic field. On the other hand, light with the wavelength of λ2 passes through the 22.5-degree permanent Faraday rotator before it is reflected by the dichroic filter back towards the input fiber. The ratio of PD4 and PD2 is used to calculate the temperature. WDM1 is used to separate the two wavelengths into two separate paths and WDM2 is used to combine the two wavelengths into the same fiber.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document and attached appendices.

What is claimed is:

1. A current sensor based on optical sensing, comprising:
a light source that produces probe light;
a first fiber line coupled to receive the probe light from the light source and to direct the received probe light along the fiber line;
an optical current sensor head coupled to the first fiber line to receive the probe light and configured to include an input polarization prism to separate the received probe light into first and second polarized input beams in different polarizations, a Faraday material located to receive and transmit both the first and second polarized input beams as first and second output beams with rotated polarizations in connection with a magnetic field of a current present near the Faraday material, and an output polarization prism that receives the first and second output beams from the Faraday material and directs the received first and second output beams to merge into an output probe beam carrying information of the current, wherein a polarization direction of the input polarization prism and an polarization direction of the output polarization prism are oriented to be at 45 degrees to each other; and
a second fiber line coupled to the optical current sensor head to receive the output probe beam from the output polarization prism;
an optical detection unit coupled to the second fiber line to receive the output probe beam from the optical current sensor head; and
a measurement module that receives an detector output from the optical detection unit to obtain information of the current.

2. The sensor as in claim 1, wherein the optical current sensor head includes:

a first fiber collimator coupled to the first fiber line to receive the probe light and to direct the received probe light to the input polarization prism; and
a second fiber collimator coupled to the second fiber line to direct the output probe beam into the second fiber line.

3. The sensor as in claim 1, comprising:
an optical power detector coupled to receive a portion of the probe light from the light source to detect a power fluctuation of the probe light,
wherein the measurement module that processes the detector output from the optical detector and an output from the optical power detector in obtaining the information of the current.

4. A current sensor based on optical sensing, comprising:
a light source that produces probe light;
a first fiber line coupled to receive the probe light from the light source and to direct the received probe light along the fiber line;
an optical current sensor head coupled to the first fiber line to receive the probe light and configured to include an input polarization beam displacer made from a birefringent material to transform the received probe light into first and second polarized input beams in different polarizations, a Faraday rotator located to receive and transmit both the first and second polarized input beams with a rotation of 45 degrees in polarization, a Faraday material located to receive and transmit both the first and second polarized input beams from the Faraday rotator as first and second output beams with rotated polarizations in connection with a magnetic field of a current present near the Faraday material, and an output polarization beam displacer made from a birefringent material that receives the first and second output beams from the Faraday material and directs and transforms the received first and second output beams to merge into an output probe beam carrying information of the current; and
a second fiber line coupled to the optical current sensor head to receive the output probe beam from the output polarization beam displacer;
an optical detection unit coupled to the second fiber line to receive the output probe beam from the optical current sensor head; and
a measurement module that receives an detector output from the optical detection unit to obtain information of the current.

5. The sensor as in claim 4, wherein the optical current sensor head includes:
a first fiber collimator coupled to the first fiber line to receive the probe light and to direct the received probe light to the input beam displacer; and
a second fiber collimator coupled to the second fiber line to direct the output probe beam into the second fiber line.

6. The sensor as in claim 4, comprising:
an optical power detector coupled to receive a portion of the probe light from the light source to detect a power fluctuation of the probe light,
wherein the measurement module that processes the detector output from the optical detector and an output from the optical power detector in obtaining the information of the current.

7. The sensor as in claim 4, wherein:
the Faraday rotator is magnetically shielded from an influence of any external magnetic field.

8. A temperature sensor based on optical sensing, comprising:
a light source that produces probe light;
a first fiber line coupled to receive the probe light from the light source and to direct the received probe light along the fiber line;
an optical temperature sensor head coupled to the first fiber line to receive the probe light and configured to include an input polarization beam displacer made from a birefringent material to transform the received probe light into first and second polarized input beams in different polarizations, a Faraday rotator that is magnetically shielded from an influence of any external magnetic field and located to receive and transmit both the first and second polarized input beams with a rotation of at or near 45 degrees in polarization as first and second output beams, and an output polarization beam displacer made from a birefringent material that receives the first and second output beams from the Faraday rotator and directs and transform the received first and second output beams to merge into an output probe beam carrying information of the temperature at the Faraday rotator;
a second fiber line coupled to the optical temperature sensor head to receive the output probe beam from the output polarization beam displacer;
an optical detection unit coupled to the second fiber line to receive the output probe beam from the optical temperature sensor head; and
a measurement module that receives an detector output from the optical detection unit to obtain information of the temperature.

9. The sensor as in claim 8, wherein the optical temperature sensor head includes:
a first fiber collimator coupled to the first fiber line to receive the probe light and to direct the received probe light to the input beam displacer; and
a second fiber collimator coupled to the second fiber line to direct the output probe beam into the second fiber line.

10. A current sensor based on optical sensing, comprising:
a light source that produces probe light;
a fiber line coupled to receive the probe light from the light source;
an optical current sensor head coupled to the fiber line to receive the probe light and configured to include a polarization beam displacer made from a birefringent material to transform the received probe light into first and second polarized input beams in different polarizations, a Faraday rotator located to receive and transmit both the first and second polarized input beams with a rotation at or near 22.5 degrees in polarization, a Faraday material located to receive and transmit both the first and second polarized input beams from the Faraday rotator with rotated polarizations in connection with a magnetic field of a current present near the Faraday material, and an optical reflector located to receive and reflect the first and second input beams from the Faraday material back to the Faraday material and the Faraday rotator to reach the polarization beam displacer which directs and transforms the received first and second output beams to merge into an output probe beam carrying information of the current;
a fiber collimator coupled to the fiber line to direct the probe light from the light source into the polarization beam displacer and to direct the output probe beam from the polarization beam displacer into the fiber line;
an optical detection unit coupled to the fiber line to receive the output probe beam from the optical current sensor head; and
a measurement module that receives an detector output from the optical detection unit to obtain information of the current.

11. The sensor as in claim 10, comprising:
an optical power detector coupled to receive a portion of the probe light from the light source to detect a power fluctuation of the probe light,
wherein the measurement module processes the detector output from the optical detector and an output from the optical power detector in obtaining the information of the current.

12. A sensor system based on optical sensing, comprising:
a first fiber link that receives probe light for sensing a temperature at a remote location;
a second fiber link that receive probe light for sensing a current at the remote location; and
a sensor head at the remote location and including an optical temperature sensor coupled to the first fiber link and an optical current sensor coupled to the second fiber link,
wherein the optical temperature sensor is coupled to the fiber line to receive a portion of the probe light and configured to include a polarization prism to separate the received probe light into first and second polarized input beams in different polarizations, a Faraday rotator that is magnetically shielded from an influence of any external magnetic field and located to receive and transmit both the first and second polarized input beams with a rotation of at or near 22.5 degrees in polarization as first and second output beams, and an optical reflector located to receive and reflect the first and second input beams from the Faraday material back to the Faraday material and the Faraday rotator to reach the polarization prism which directs the received first and second output beams to merge into an output probe beam carrying information of the temperature at the Faraday rotator;
the optical temperature sensor includes a fiber collimator coupled to the fiber line to direct the probe light from the light source into the polarization prism and to direct the output probe beam from the polarization prism into the fiber line;
the optical temperature sensor includes an optical detection unit coupled to the fiber line to receive the output probe beam from the optical temperature sensor head; and
the optical temperature sensor includes a measurement module that receives an detector output from the optical detection unit to obtain information of the temperature.

13. The system as in claim 12, comprising:
a first light source that produces the probe light in the first fiber link; and
a second light source that produces the probe light in the second fiber link.

14. The system as in claim 12, comprising:
a single light source that produces the probe light in the first and second fiber links; and
an optical splitter that splits the probe light from the single light source into a first probe beam coupled into the first fiber link and a second probe beam coupled into the second fiber link.

15. A sensor system based on optical sensing, comprising:
a first fiber link that receives probe light for sensing a temperature at a remote location;

a second fiber link that receive probe light for sensing a current at the remote location; and a sensor head at the remote location and including an optical temperature sensor coupled to the first fiber link and an optical current sensor coupled to the second fiber link, wherein the optical current sensor is coupled to the fiber line to receive a portion of the probe light and configured to include a polarization prism to separate the received probe light into first and second polarized input beams in different polarizations, a Faraday rotator located to receive and transmit both the first and second polarized input beams with a rotation at or near 22.5 degrees in polarization, a Faraday material located to receive and transmit both the first and second polarized input beams from the Faraday rotator with rotated polarizations in connection with a magnetic field of a current present near the Faraday material, and an optical reflector located to receive and reflect the first and second input beams from the Faraday material back to the Faraday material and the Faraday rotator to reach the polarization prism which directs the received first and second output beams to merge into an output probe beam carrying information of the current;

the optical current sensor includes a fiber collimator coupled to the fiber line to direct the probe light from the light source into the polarization prism and to direct the output probe beam from the polarization prism into the fiber line;

the optical current sensor includes an optical detection unit coupled to the fiber line to receive the output probe beam from the optical current sensor head; and the optical current sensor includes a measurement module that receives an detector output from the optical detection unit to obtain information of the current.

16. The system as in claim 15, comprising:
a first light source that produces the probe light in the first fiber link; and
a second light source that produces the probe light in the second fiber link.

17. The system as in claim 15, comprising:
a single light source that produces the probe light in the first and second fiber links; and
an optical splitter that splits the probe light from the single light source into a first probe beam coupled into the first fiber link and a second probe beam coupled into the second fiber link.

18. A current sensor based on optical sensing and temperature compensation, comprising:
a fiber line coupled to receive probe light containing light at first and second optical wavelengths;
an optical current sensor head coupled to the fiber line to receive the probe light and configured to include a polarization beam displacer made from a birefringent material to transform the received probe light into first and second polarized input beams in different polarizations, a Faraday rotator which is magnetically shielded from an external magnetic field and located to receive the first and second polarized input beams to cause a rotation in polarization, a dichroic filter located downstream from the Faraday rotator to receive light from the Faraday rotator and configured to transmit light at the first optical wavelength and reflect light at the second optical wavelength, a sensing Faraday material that is not magnetically shielded and placed in an optical path of light transmitted by the dichroic filter to sense a polarization rotation in light at the second optical wavelength caused by a temperature change and a magnetic field of an electric current at or near the sensing Faraday material, and an optical reflector downstream from the sensing Faraday material to reflect the light at the second optical wavelength back to the sensing Faraday material, the dichroic filter and the Faraday rotator to return to the polarization beam displacer and the fiber line along with the reflected light at the first optical wavelength;

a first optical detector coupled to receive reflected light from the fiber line at the first optical wavelength that carries information of the current to be measured and an influence of a temperature at the optical current sensor head;

a second optical detector coupled to receive reflected light from the fiber line at the second optical wavelength that carries information of the temperature at the Faraday rotator; and a measurement module that receives detector outputs from the first and second optical detectors to obtain information of the current to be measured and to compensate for an effect to the current measurement by the temperature.

19. The sensor as in claim 18, comprising:
a first light source that generates the probe light at the first optical wavelength; and
a second light source that generates the probe light at the second optical wavelength.

20. The sensor as in claim 18, comprising:
a single light source that generates the probe light at the first optical wavelength and at the second optical wavelength,
wherein the probe light is coupled into the fiber line.

21. The sensor as in claim 20, comprising:
a fiber coupler coupled to the fiber line to split a portion of the probe light from the light source as a power monitor signal beam, and to split a portion of the reflected light from the optical current sensor head as a signal beam;
an optical splitter coupled to receive the signal beam containing light at the first and second optical wavelengths and to output a first signal beam at the first optical wavelength to the first optical detector and a second signal beam at the second optical wavelength to the second optical detector;
an optical power monitor detector coupled to receive the power monitor signal beam from the fiber coupler; and
wherein the measurement module that receives detector outputs from the first and second optical detectors and the optical power monitor detector to obtain information of the current to be measured and to compensate for effects to the current measurement by the temperature and by power fluctuation in the light source.

22. The sensor as in claim 20, wherein:
the Faraday rotator is configures to cause a rotation at or near 22.5 degrees in polarization.

23. A current sensor based on optical sensing and temperature compensation, comprising:
a fiber line coupled to receive probe light containing light at first and second optical wavelengths;
an optical current sensor head coupled to the fiber line to receive the probe light and configured to include a polarization prism to separate the received probe light into first and second polarized input beams in different polarizations, a Faraday rotator which is magnetically shielded from an external magnetic field and located to receive the first and second polarized input beams to cause a rotation in polarization, a dichroic filter located downstream from the Faraday rotator to receive light from the Faraday rotator and configured to transmit light at the first optical wavelength and reflect light at the second optical wavelength, a sensing Faraday material that is not magnetically shielded and placed in an optical path of light transmitted by the dichroic filter to sense a polarization rotation in light at the second optical wavelength caused by a temperature change and a magnetic field of an electric current at or near the sensing Faraday material, and an optical reflector downstream from the sensing Faraday material to reflect the light at the second optical wavelength back to the sensing Faraday material, the dichroic filter and the Faraday rotator to return to the polarization prism and the fiber line along with the reflected light at the first optical wavelength;

a first optical detector coupled to receive reflected light from the fiber line at the first optical wavelength that carries information of the current to be measured and an influence of a temperature at the optical current sensor head;

a second optical detector coupled to receive reflected light from the fiber line at the second optical wavelength that carries information of the temperature at the Faraday rotator;

a measurement module that receives detector outputs from the first and second optical detectors to obtain information of the current to be measured and to compensate for an effect to the current measurement by the temperature;

a single light source that generates the probe light at the first optical wavelength and at the second optical wavelength, wherein the probe light is coupled into the fiber line;

a first fiber coupler coupled to the fiber line to split a portion of the probe light from the light source as a first power monitor signal beam, and to split a portion of the reflected light from the optical current sensor head as a first signal beam to the first optical detector;

a second fiber coupler coupled to the fiber line to split a portion of the probe light from the light source as a second power monitor signal beam, and to split a portion of the reflected light from the optical current sensor head as a second signal beam to the second optical detector;

a first optical bandpass filter placed in front of the first optical detector to transmit light at the first optical wavelength into the first optical detector;

a second optical bandpass filter placed in front of the second optical detector to transmit light at the second optical wavelength into the second optical detector;

a first optical power monitor detector coupled to receive the first power monitor signal beam from the first fiber coupler;

a third optical bandpass filter placed in front of the first optical power monitor detector to transmit light at the first optical wavelength into the first optical power monitor detector;

a second optical power monitor detector coupled to receive the second power monitor signal beam from the second fiber coupler;

a fourth optical bandpass filter placed in front of the second optical power monitor detector to transmit light at the second optical wavelength into the second optical power monitor detector; and wherein the measurement module that receives detector outputs from the first and second optical detectors and the first and second optical power monitor detectors to obtain information of the current to be measured and to compensate for effects to the current measurement by the temperature and by power fluctuations at the first and second optical wavelengths in the light source.

24. A current sensor based on optical sensing and temperature compensation, comprising:

a fiber line coupled to receive probe light containing light at first and second optical wavelengths;

an optical current sensor head coupled to the fiber line to receive the probe light and configured to include a polarization prism to separate the received probe light into first and second polarized input beams in different polarizations, a Faraday rotator which is magnetically shielded from an external magnetic field and located to receive the first and second polarized input beams to cause a rotation in polarization, a dichroic filter located downstream from the Faraday rotator to receive light from the Faraday rotator and configured to transmit light at the first optical wavelength and reflect light at the second optical wavelength, a sensing Faraday material that is not magnetically shielded and placed in an optical path of light transmitted by the dichroic filter to sense a polarization rotation in light at the second optical wavelength caused by a temperature change and a magnetic field of an electric current at or near the sensing Faraday material, and an optical reflector downstream from the sensing Faraday material to reflect the light at the second optical wavelength back to the sensing Faraday material, the dichroic filter and the Faraday rotator to return to the polarization prism and the fiber line along with the reflected light at the first optical wavelength;

a first optical detector coupled to receive reflected light from the fiber line at the first optical wavelength that carries information of the current to be measured and an influence of a temperature at the optical current sensor head;

a second optical detector coupled to receive reflected light from the fiber line at the second optical wavelength that carries information of the temperature at the Faraday rotator;

a measurement module that receives detector outputs from the first and second optical detectors to obtain information of the current to be measured and to compensate for an effect to the current measurement by the temperature;

a single light source that generates the probe light at the first optical wavelength and at the second optical wavelength, wherein the probe light is coupled into the fiber line;

a fiber coupler coupled to the fiber line to split a portion of the probe light from the light source as a power monitor signal beam, and to split a portion of the reflected light from the optical current sensor head as a signal beam;

a first optical splitter coupled to receive the signal beam containing light at the first and second optical wavelengths and to output a first signal beam at the first optical wavelength to the first optical detector and a second signal beam at the second optical wavelength to the second optical detector;

a second optical splitter coupled to receive the power monitor signal beam containing light at the first and second optical wavelengths and to output a first power monitor signal beam at the first optical wavelength and a second power monitor signal beam at the second optical wavelength;

a first optical power monitor detector coupled to receive the first power monitor signal beam from the second fiber coupler; and a second optical power monitor detector coupled to receive the second power monitor signal beam from the second fiber coupler;

wherein the measurement module that receives detector outputs from the first and second optical detectors and the first and second optical power monitor detectors to obtain information of the current to be measured and to compensate for effects to the current measurement by the temperature and by power fluctuations at the first and second optical wavelengths in the light source.

25. A current sensor based on optical sensing and temperature compensation, comprising:

a fiber line coupled to receive probe light containing light at first and second optical wavelengths;

an optical current sensor head coupled to the fiber line to receive the probe light and configured to include a polarization prism to separate the received probe light into first and second polarized input beams in different polarizations, a Faraday rotator which is magnetically shielded from an external magnetic field and located to receive the first and second polarized input beams to cause a rotation in polarization, a dichroic filter located downstream from the Faraday rotator to receive light from the Faraday rotator and configured to transmit light at the first optical wavelength and reflect light at the second optical wavelength, a sensing Faraday material that is not magnetically shielded and placed in an optical path of light transmitted by the dichroic filter to sense a polarization rotation in light at the second optical wavelength caused by a temperature change and a magnetic field of an electric current at or near the sensing Faraday material, and an optical reflector downstream from the sensing Faraday material to reflect the light at the second optical wavelength back to the sensing Faraday material, the dichroic filter and the Faraday rotator to return to the polarization prism and the fiber line along with the reflected light at the first optical wavelength;

a first optical detector coupled to receive reflected light from the fiber line at the first optical wavelength that carries information of the current to be measured and an influence of a temperature at the optical current sensor head;

a second optical detector coupled to receive reflected light from the fiber line at the second optical wavelength that carries information of the temperature at the Faraday rotator;

a measurement module that receives detector outputs from the first and second optical detectors to obtain information of the current to be measured and to compensate for an effect to the current measurement by the temperature;

a single light source that generates the probe light at the first optical wavelength and at the second optical wavelength, wherein the probe light is coupled into the fiber line; and an optical monitor module coupled to the fiber link that includes the first and second optical detectors and further includes:

a first optical coupler coupled to receive the probe light containing light at the first and second optical wavelengths from the light source and to output a first signal beam at the first optical wavelength along a first optical path and a second signal beam at the second optical wavelength along a second optical path;

a second optical coupler coupled to the first and second optical paths to combine the light at the first and second optical wavelengths into a combined optical beam and further coupled to the fiber link to direct the combined optical beam into the fiber link to the optical current sensor head and to split the reflected light into a first reflected light beam at the first optical wavelength along the first optical path and a second reflected light beam at the second optical wavelength along the second optical path;

a third optical coupler coupled to the first optical path to split a portion of the first signal beam at the first optical wavelength as a first power monitor signal beam at the first optical wavelength and to split a portion of the first reflected light beam at the first optical wavelength as a first signal beam at the first optical wavelength into the first optical detector;

a first optical power monitor detector coupled to receive the first power monitor signal beam from the third optical coupler;

a fourth optical coupler coupled to the second optical path to split a portion of the second signal beam at the second optical wavelength as a second power monitor signal beam at the second optical wavelength and to split a portion of the second reflected light beam at the second optical wavelength as a second signal beam at the second optical wavelength into the second optical detector; and a second optical power monitor detector coupled to receive the second power monitor signal beam from the fourth optical coupler;

wherein the measurement module that receives detector outputs from the first and second optical detectors and the first and second optical power monitor detectors to obtain information of the current to be measured and to compensate for effects to the current measurement by the temperature and by power fluctuations at the first and second optical wavelengths in the light source.

* * * * *